United States Patent
Ueda et al.

(10) Patent No.: US 12,421,164 B2
(45) Date of Patent: Sep. 23, 2025

(54) SUBSTRATE FOR TRANSFERRING MICROSTRUCTURES AND METHOD FOR MANUFACTURING THE SAME

(71) Applicant: Shin-Etsu Chemical Co., Ltd., Tokyo (JP)

(72) Inventors: Shuhei Ueda, Joetsu (JP); Masaki Takeuchi, Joetsu (JP); Hiroyuki Yamazaki, Joetsu (JP); Kento Tsukada, Joetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 840 days.

(21) Appl. No.: 17/313,184

(22) Filed: May 6, 2021

(65) Prior Publication Data
US 2021/0355025 A1 Nov. 18, 2021

(30) Foreign Application Priority Data
May 14, 2020 (JP) .................... 2020-085108

(51) Int. Cl.
| | |
|---|---|
| C03C 17/30 | (2006.01) |
| C03C 15/00 | (2006.01) |
| C09J 5/06 | (2006.01) |
| C09J 7/20 | (2018.01) |
| C09J 7/38 | (2018.01) |

(Continued)

(52) U.S. Cl.
CPC ........... *C03C 17/30* (2013.01); *C03C 15/00* (2013.01); *C09J 5/06* (2013.01); *C09J 7/20* (2018.01); *C09J 7/38* (2018.01); *C09J 183/04* (2013.01); *H10H 20/01* (2025.01); *H10H 20/018* (2025.01); *C03C 2217/70* (2013.01);

(Continued)

(58) Field of Classification Search
CPC ..................................................... C03C 17/30
See application file for complete search history.

(56) References Cited

U.S. PATENT DOCUMENTS

| | | | |
|---|---|---|---|
| 2002/0064032 A1 | 5/2002 | Oohata | |
| 2010/0279212 A1* | 11/2010 | Shirasaki | ......... G03F 1/64 |
| | | | 430/5 |

(Continued)

FOREIGN PATENT DOCUMENTS

| | | | |
|---|---|---|---|
| JP | 2002-118124 A | | 4/2002 |
| JP | 2019-047106 | * | 3/2019 |

OTHER PUBLICATIONS

Machine translation of document N.*

(Continued)

*Primary Examiner* — Austin Murata
(74) *Attorney, Agent, or Firm* — Birch, Stewart, Kolasch & Birch, LLP

(57) ABSTRACT

Provided is a substrate for transferring microstructures such as a micro LED including an engraved mark. The substrate for transferring microstructures is less likely to cause a recognizing error of the engraved mark to occur in a reading device, and makes it possible to stably and continuously read the engraved mark.

A substrate for transferring microstructures includes a synthetic quartz glass substrate and a silicone pressure-sensitive adhesive agent layer provided on a front surface of the synthetic quartz glass substrate. The substrate includes an engraved mark provided in the from surface.

20 Claims, 2 Drawing Sheets

(51) Int. Cl.
*C09J 183/04* (2006.01)
*H10H 20/01* (2025.01)

(52) U.S. Cl.
CPC ..... *C03C 2217/90* (2013.01); *C09J 2203/326* (2013.01); *C09J 2400/143* (2013.01)

(56) References Cited

U.S. PATENT DOCUMENTS

| | | | |
|---|---|---|---|
| 2011/0159785 A1* | 6/2011 | Harada | C03C 19/00 451/36 |
| 2014/0158300 A1* | 6/2014 | Hayata | C03B 19/00 156/345.3 |
| 2017/0326688 A1* | 11/2017 | Turner | B23K 26/122 |
| 2017/0330156 A1* | 11/2017 | Kato | B41M 5/24 |
| 2020/0103996 A1* | 4/2020 | Katagiri | G03C 1/047 |

OTHER PUBLICATIONS

"Specifications for Double-Sided Polishing Wafer Back Surface Marking of Two-Dimensional Matrix Code Symbol," SEMI T7-0303, North American Traceability Committee, Mar. 2003, 4 pages.

\* cited by examiner

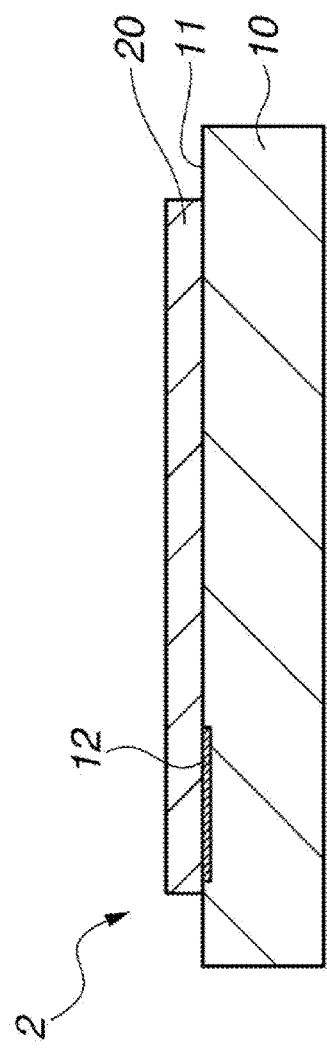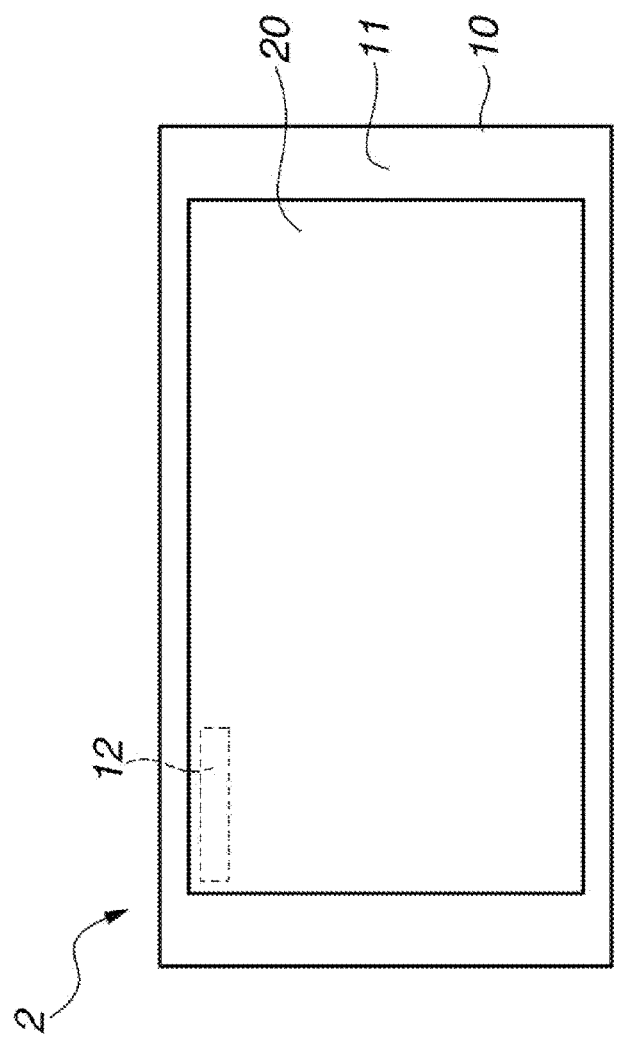

SUBSTRATE FOR TRANSFERRING MICROSTRUCTURES AND METHOD FOR MANUFACTURING THE SAME

CROSS-REFERENCE TO RELATED APPLICATION

This non-provisional application claims priority under 35 U.S.C. § 119(a) on Patent Application No. 2020-085108 filed in Japan on May 14, 2020, the entire contents of which are hereby incorporated by reference.

TECHNICAL FIELD

The present invention relates to a substrate for transferring microstructures and a method for manufacturing the same, and more specifically relates to a substrate including an identification laser engraved in a substrate for transferring microstructures such as a micro light emitting diode (hereinafter, also referred to as "micro LED"), and a method for manufacturing the same.

BACKGROUND ART

In recent years, electronic devices such as smartphones, liquid crystal displays, and on-board automotive parts are required not only to have higher performance but also to save space and energy. At the same time, electrical or electronic parts to be mounted are also smaller and finer. An assembly process for the parts is also further complicated year by year.

Patent Document 1 proposes microstructures and a method for transferring microstructures in the transfer of finer elements, for example, microstructures such as a micro LED. In the method, the microstructures can be efficiently transferred with high accuracy without increasing the number of processes in a state where the microstructures are temporarily fixed to one donor substrate.

In order to manage a substrate flowing through a production line, it is common to directly engrave characters and numbers in the substrate using a laser. For example, in Non-Patent Document 1, standard for a laser engraved mark in the substrate is determined. The engraved mark is also useful for reading the information to provide quality management, and management of the frequency of use and the degree of wear of products after shipment, and the like, and is widely adopted.

CITATION LIST

Patent Document 1: JP-A 2002-118124
Non-Patent Document 1: SEMI T7 0303 Specifications for Double-Sided Polishing Wafer Back Surface Marking of Two-Dimensional Matrix Code Symbol, North American Traceability Committee, published in March 2003.

SUMMARY OF THE INVENTION

However, in a substrate for transferring microstructures including a pressure-sensitive adhesive agent layer described in Patent Document 1, a resin is bonded or coated after engraving. Therefore, when the substrate is engraved, the back surface of the substrate is usually engraved. However, the back surface of the substrate is apt to be soiled or scratched due to contact with a raised part around the engraved mark, which may make it impossible to continuously and stably read the engraved mark.

The present invention has been made in view of the above circumstances, and it is an object of the present invention to provide a substrate including an engraved mark for transferring microstructures such as a micro LED. The substrate for transferring microstructures is less likely to cause a recognizing error of the engraved mark to occur in a reading device, and makes it possible to stably and continuously read the engraved mark.

As a result of diligent studies to achieve the above object, the present inventors have found that a synthetic quartz glass substrate for transferring microstructures, including an engraved mark provided in the front surface of the substrate and a silicone pressure-sensitive adhesive agent layer provided thereon can solve the problems, and have completed the present invention.

That is, the present invention provides the following 1 to 7:

1. A substrate for transferring microstructures, including:
   a synthetic quartz glass substrate; and
   a silicone pressure-sensitive adhesive agent layer provided on a front surface of the synthetic quartz glass substrate,
   wherein the substrate includes an engraved mark provided in the front surface;

2. The substrate for transferring microstructures according to 1, wherein the synthetic quartz glass substrate has a power spectral density of $10^{12}$ nm$^4$ or less at a spatial frequency of 1 mm$^{-1}$ or more, the power spectral density being obtained by measuring a region of 6.01 mm×6.01 mm in the front and back surfaces of the synthetic quartz glass substrate at a pixel count of 1240×1240 with a white light interferometer;

3. The substrate for transferring microstructures according to 1 or 2, wherein surface roughness (Ra) of a back surface of the synthetic quartz glass substrate is 0.05 μm or less;

4. The substrate for transferring microstructures according to any one of 1 to 3, wherein the engraved mark is a laser mark having a depth of 3 to 25 μm and a dot size of 20 to 200 μm;

5. A method for manufacturing a substrate for transferring microstructures according to any one of 1 to 4, the method including the steps of:
   providing an engraved mark in a front surface of a synthetic quartz glass substrate to obtain the synthetic quartz glass substrate including the engraved mark; and
   providing a silicone pressure-sensitive adhesive agent layer on the front surface of the synthetic quartz glass substrate including the engraved mark;

6. The method for manufacturing a substrate for transferring microstructures according to 5, wherein the step of providing the silicone pressure-sensitive adhesive agent layer is a step of applying a silicone pressure-sensitive adhesive agent composition onto the front surface of the synthetic quartz glass substrate including the engraved mark, followed by curing; and 7. A method for manufacturing a substrate for transferring microstructures according to 5, wherein the step of providing the silicone pressure-sensitive adhesive agent layer is a step of bonding a cured product made of a silicone pressure-sensitive adhesive agent composition onto the front surface of the synthetic quartz glass substrate including the engraved mark.

ADVANTAGEOUS EFFECTS OF THE INVENTION

A substrate for transferring microstructures of the present invention includes an engraved mark provided on the front surface of the substrate, whereby the occurrence of stains and scratches on the engraved mark part is suppressed, and as a result, the engraved mark can be stably read.

BRIEF DESCRIPTION OF THE DRAWINGS

FIG. 1A is a side view; and FIG. 1B is a top view; and FIGS. 2A and 2B are views showing a substrate for transferring microstructures according to a second embodiment of the present invention; FIG. 2A is a side view; and FIG. 2B is a top view.

DESCRIPTION OF THE PREFERRED EMBODIMENT

Hereinafter, the present invention is described in more detail.

[1] Substrate for Transferring Microstructures

Figure 1A:
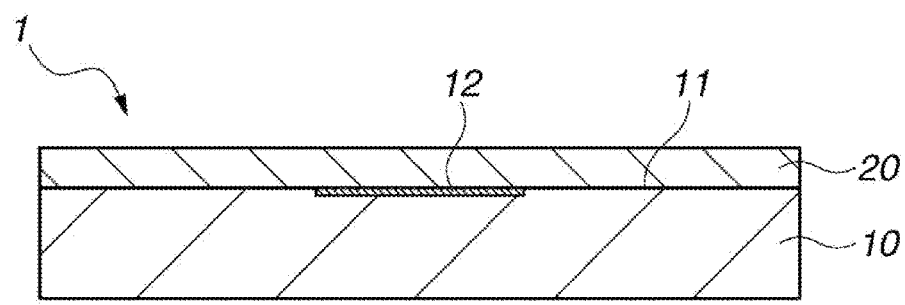
FIGS. 1A and 1B are views showing a substrate for transferring microstructures according to a first embodiment of the present invention.
Figure 1B:
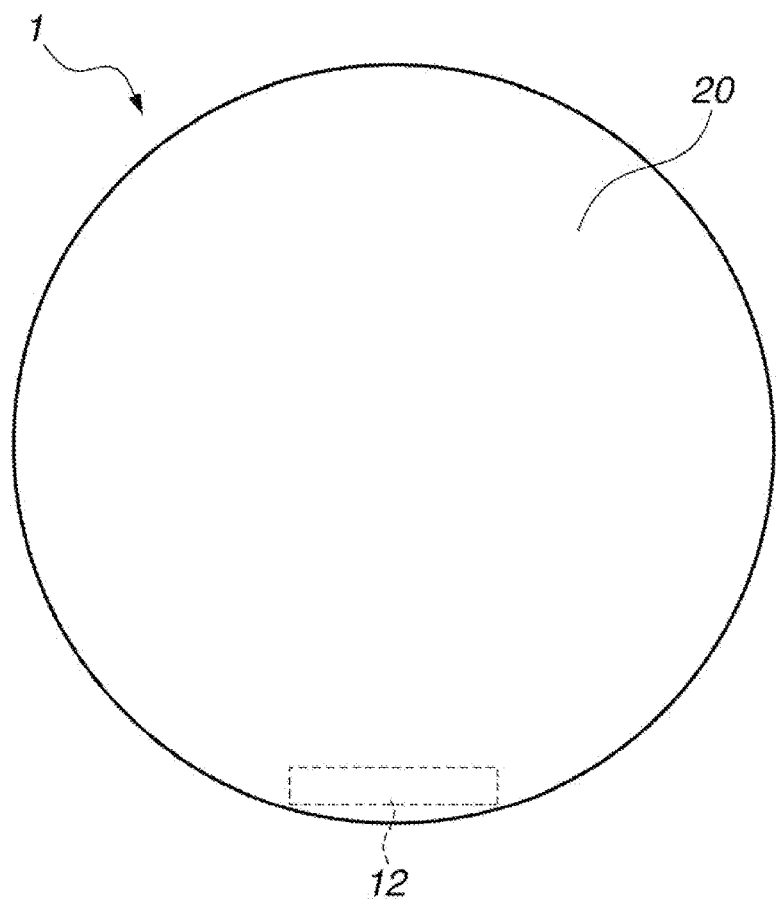

A substrate for transferring microstructures of the present invention includes a synthetic quartz glass substrate 10 and a silicone pressure-sensitive adhesive agent layer 20 provided on a front surface 11 of the synthetic quartz glass substrate 10, for example, as in a first embodiment shown in FIGS. 1A and 1B and a second embodiment shown in FIGS. 2A and 2B. An engraved mark 12 is applied to the front surface 11 of the substrate 10.

In the present invention, from the viewpoint of suppressing a position gap when the microstructures are transferred to improve the transfer accuracy, it is necessary to use a synthetic quartz glass substrate which is a material having a low coefficient of thermal expansion as the base material of the transferring substrate.

The shape of the synthetic quartz glass substrate to be used is not particularly limited, and for example, appropriate shapes such as a circular disk (see FIG. 1B) used in the first embodiment and a square plate (FIG. 2B) used in the second embodiment can be adopted depending on usage situations.

The size of the synthetic quartz glass substrate is not also particularly limned, but for example, a circular disk shape (for example, FIGS. 1A and 1B) having a diameter of 3 mm to 300 mm, and a square plate shape (for example, FIGS. 2A and 2B) having a diagonal length of 3 mm to 300 mm, and the like can be adopted.

Furthermore, the thickness is not also particularly limited, but from the viewpoint of suppressing flexure during the transfer of elements, it is preferably 0.5 mm to 5.0 mm, and more preferably 1 mm to 3 mm.

In the present invention, the flatness of the front surface of the synthetic quartz glass substrate is not particularly limited, but from the viewpoint of improving the transfer accuracy, SORI≤10 µm is preferable; SORI≤5 µm is more preferable; and SORI≤2 µm is still more preferable.

The variation in the thickness is not also particularly limited, but from the same viewpoint, 10 µm or less is preferable; 5 µm or less is more preferable; and 1 µm or less is still more preferable.

The flatness SORI is an index defined in SEMI. The variations in the flatness and the thickness can be measured by an optical interference type flatness measuring instrument or a laser displacement meter or the like.

From the viewpoint of maintaining the transfer accuracy of the microstructures, the front surface of the synthetic quartz glass substrate preferably has a power spectral density of $10^{12}$ nm$^4$ or less at a spatial frequency of 1 mm$^{-1}$ or more. The power spectral density is obtained by measuring a region of 6.01 mm×6.01 mm at a pixel count of 1240×1240 with a white light interferometer. In particular, for example, considering a distance between the microstructures when the microstructures are micro LEDs, the power spectral density at the spatial frequency of 10 mm$^{-1}$ or more and 50 mm$^{-1}$ or less is preferably $10^9$ nm$^4$ or less. The power spectral density is obtained by measuring the region of 6.01 mm×6.01 mm at the pixel count of 1240×1240 with the white light interferometer.

Furthermore, the surface roughness (Ra) of the back surface of the synthetic quartz glass substrate is not particularly limited, but it is preferably 0.05 µm or less, and more preferably 0.01 µm or less. Such a range is likely to ensure transparency, which makes it possible to reduce the possibility of causing a reading error due to a reading device.

In the substrate for transferring microstructures of the present invention, the accuracy of the variation in the thickness of the laminated body in consideration of both the synthetic quartz glass substrate and the silicone pressure-sensitive adhesive agent layer provided on the front surface thereof is also important in order to temporarily fix the microstructures with high accuracy.

The variation in the thickness of the laminated body is not particularly limited, but it is preferably 12 µm or less, more preferably 6 µm or less, and still more preferably 2 µm or less.

It is preferable that the silicone pressure-sensitive adhesive agent layer on the substrate for transferring microstructures of the present invention is formed of an ultraviolet curable silicone pressure-sensitive adhesive agent composition, which contains the following components (A) to (D), and free of a non-crosslinkable organopolysiloxane resin.

The use of such a composition allows instant pressure-sensitive adhesion and peeling that do not provide a so-called adhesive agent residue during peeling, whereby the microstructures are likely to be transferred with high accuracy.

(A) 100 parts by weight of an organopolysiloxane having, in one molecule, two groups having the following general formula (1):

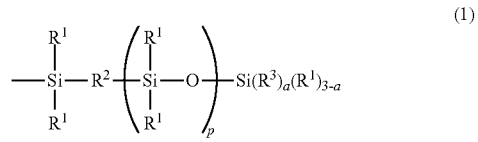

(1)

wherein R$^1$ each independently represent a C1-20 monovalent hydrocarbon group, preferably a C1-10 monovalent hydrocarbon group excluding aliphatic unsaturated groups, and more preferably a C1-8 monovalent hydrocarbon group excluding aliphatic unsaturated groups; R$^2$ represents an oxygen atom or a C1-20 alkylene group, preferably a C1-10 alkylene group, and more preferably a C1-5 alkylene group; R$^3$ each independently represent an acryloyloxyalkyl group, a methacryloyloxyalkyl group, an acryloyloxyalkyloxy group, or a methacryloyloxyalkyloxy group; "p" represents a number satisfying 0≤p≤10; and "a" represents a number satisfying 1≤a≤3, (B) 1 to 200 parts by weight of a monofunctional (meth) acrylate compound free of a siloxane structure, (C) 1 to 1,000 parts by weight of an organopolysiloxane resin composed of (a) units having the following general formula (2):

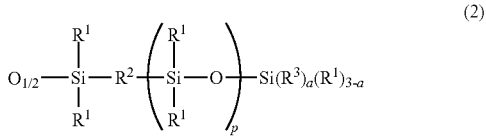

(2)

wherein $R^1$, $R^2$, $R^3$, a, and p have the same meaning as above, (b) $R^4{}_3SiO_{1/2}$ units (in the formula, $R^4$ represents a C1-10 monovalent hydrocarbon group.), and (c) $SiO_{4/2}$ units, a molar ratio of the total of the (a) units and the (b) units to the (c) units being in the range 0.4 to 1.2:1; and (D) 0.01 to 20 parts by weight of a photopolymerization initiator.

The C1-20 monovalent hydrocarbon group $R^1$ may be straight, branched or cyclic. Examples thereof include alkyl groups such as methyl, ethyl, n-propyl, isopropyl, n-butyl, isobutyl, tert-butyl, n-hexyl, cyclohexyl, n-octyl, 2-ethylhexyl, and n-decyl groups; alkenyl groups such as vinyl, allyl(2-propenyl), 1-propenyl, isopropenyl, and butenyl groups; aryl groups such as phenyl, tolyl, xylyl, and naphthyl groups; and aralkyl groups such as benzyl, phenylethyl, and phenylpropyl groups.

In these monovalent hydrocarbon groups, some or all of the carbon-bonded hydrogen atoms may be substituted by other substituents. Examples thereof include halogen-substituted hydrocarbon groups such as chloromethyl, bromoethyl, and trifluoropropyl groups, and cyano-substituted hydrocarbon groups such as a cyanoethyl group.

Among these, $R^1$ is preferably a C1-5 alkyl group and a phenyl group, and more preferably a methyl group, an ethyl group, and a phenyl group.

The C1-20 alkylene group $R^2$ may be straight, branched or cyclic. Examples thereof include methylene, ethylene, propylene, trimethylene, tetramethylene, isobutylene, pentamethylene, hexamethylene, cyclohexylene, heptamethylene, octamethylene, nonamethylene, and decylene groups.

Among these, $R^2$ is preferably an oxygen atom, a methylene group, an ethylene group, and a trimethylene group, and more preferably an oxygen atom or an ethylene group.

Furthermore, the number of carbon atoms of the alkyl (or alkylene) group in the acryloyloxyalkyl, methacryloyloxyalkyl, acryloyloxyalkyloxy or methacryloyloxyalkyloxy group of $R^3$ is not particularly limited, but it is preferably 1 to 10, and more preferably 1 to 5. Specific examples of the alkyl groups include C1-10 alkyl groups among the groups exemplified above for $R^1$.

Specific examples of the group $R^3$ include, but are not limited to, those having the following formulae.

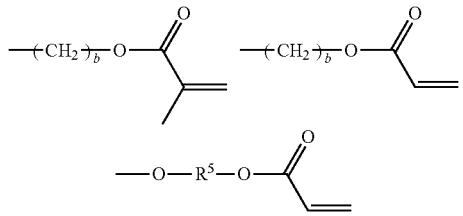

wherein "b" represents a number satisfying $1 \leq b \leq 4$, and $R^5$ represents a C1-10 alkylene group.

The above "p" represents a number satisfying $0 \leq p \leq 10$, and is preferably 0 or 1. The above "a" represents a number satisfying $1 \leq a \leq 3$, and is preferably 1 or 2.

In the organopolysiloxane molecule of the component (A), the group having the above general formula (1) may be attached to the terminal of the molecular chain and/or non-terminal positions of the molecular chain (i.e., positions midway the molecular chain or side chains from the molecular chain). For flexibility, the group having the formula (1) is preferably present at only the terminal of the molecular chain.

In the organopolysiloxane molecule of the component (A), examples of silicon-bonded organic groups other than the group having the above general formula (1) include the same groups as those exemplified above for preferably a C1-12 monovalent hydrocarbon group, and more preferably a C1-10 monovalent hydrocarbon group, excluding aliphatic unsaturated groups.

Specific examples thereof include the same groups as those exemplified above for $R^1$, but from the viewpoint of ease of synthesis, an alkyl group, an aryl group, and an alkyl halide group are preferable, and a methyl group, a phenyl group, and a trifluoropropyl group are more preferable.

The component (A) has a molecular structure which is basically a linear or branched backbone (including partially branched, linear backbone) composed of repeating diorganosiloxane units. In particular, a linear diorganopolysiloxane with both terminals of the molecular chain capped with the group having the general formula (1) is preferable.

The component (A) may be a homopolymer having such a molecular structure, a copolymer having such a molecular structure, or a mixture of two or more polymers.

Specific examples of the monofunctional (meth)acrylate compound (B) free of a siloxane structure of the component (B) include isoamyl acrylate, lauryl acrylate, stearyl acrylate, ethoxy-diethylene glycol acrylate, methoxy-triethylene glycol acrylate, 2-ethylhexyl-diglycol acrylate, phenoxyethyl acrylate, phenoxydiethylene glycol acrylate, tetrahydrofurfuryl acrylate, and isobornyl acrylate, which may be used alone or in admixture of two or more.

Among these, isobornyl acrylate is preferable.

Specific examples of the C1-10 monovalent hydrocarbon group $R^4$ in the component (C) include C1-10 monovalent hydrocarbon groups among the groups exemplified above for $R^1$. Among these, C1-5 alkyl groups such as methyl, ethyl, n-propyl, and n-butyl groups; and C6-10 aryl groups such as phenyl and tolyl groups are preferable, and a methyl group, an ethyl group, and a phenyl group are more preferable.

Like $R^1$, some or all of the carbon-bonded hydrogen atoms on the monovalent hydrocarbon group $R^4$ may be substituted by other substituents as described above.

Specific examples of the photopolymerization initiator of the component (D) include 2,2-diethoxyacetophenone, 2,2-dimethoxy-1,2-diphenylethan-1-one (Irgacure 651, manufactured by BASF), 1-hydroxy-cyclohexyl-phenyl-ketone (Irgacure 184, manufactured by BASF), 2-hydroxy-2-methyl-1-phenyl-propan-1-one (Irgacure 1173, manufactured by BASF), 2-hydroxy-1-{4-[4-(2-hydroxy-2-methyl-propionyl)-benzyl]-phenyl}-2-methyl-propan-1-one (Irgacure MBF, manufactured by BASF), phenylglyoxylic acid methyl ester (Irgacure MBF, manufactured by BASF), 2-methyl-1-[4-(methylthio)phenyl]-2-morpholinopropan-1-one (Irgacure 907, manufactured by BASF), 2-benzyl-2-dimethylamino-1-(4-morpholinophenyl)-1-butanone (Irgacure 369, manufactured by BASF), bis(2,4,6-trimethylbenzoyl)-phenylphosphine oxide (Irgacure 819, manufactured by BASF), and 2,4,6-trimethylbenzoyl-diphenyl-phosphine oxide (Irgacure TPO, manufactured by BASF). These may be used alone or in combination of two or more.

Among these, from the viewpoint of compatibility with the component (A), 2,2-diethoxyacetophenone, 2-hydroxy-2-methyl-1-phenyl-propane-1-one (Irgacure 1173, manufactured by BASF), bis(2,4,6-trimethylbenzoyl)-phenylphosphine oxide (Irgacure 819, manufactured by BASF), and 2,4,6-trimethylbenzoyl-diphenyl-phosphine oxide (Irgacure TPO, manufactured by BASF) are preferable.

In the present invention, in addition to the ultraviolet curable silicone pressure-sensitive adhesive agent composition as described above, a thermosetting silicone pressure-sensitive adhesive agent composition can also be used. Specific examples thereof include SIM series manufactured by Shin-Etsu Chemical Co., Ltd., and in particular, SIM-360, and silicone-based rubber compositions such as STP series from the viewpoint of a curing time.

The thickness of the silicone pressure-sensitive adhesive agent layer is not particularly limited, but it is preferably 1 to 100 µm, more preferably 10 to 30 µm, and still more preferably 15 to 25 µm from the viewpoint of moldability and flatness.

The shape of the silicone pressure-sensitive adhesive agent layer may be a flat shape or a shape having a protruding surface such as unevenness according to an element size and an element spacing.

For example, in the case of a silicone pressure-sensitive adhesive agent layer having a convex structure, the size and arrangement of the convex structure may be designed depending on the size and desired arrangement of a microstructure to be transferred. The upper surface of the convex structure is flat. The surface shape is not limited, and examples thereof include circular, oval, and rectangular shapes. In the case of the rectangular shape, the edges may be rounded. The width of the upper surface of the convex structure is not particularly limited, but it is preferably 0.1 µm to 1 cm, and more preferably 1 µm to 1 mm.

The form of the side surface of the convex structure is not also limited, and may be either vertical or oblique. The height of the convex structure is preferably 1 to 100 µm, and more preferably 10 to 30 µm. The pitch distance between spaced-apart adjacent convex structures is preferably 0.1 µm to 10 cm, and more preferably 1 µm to 1 mm.

The size of the silicone pressure-sensitive adhesive agent layer is not particularly limited as long as it fits into the front surface of the synthetic quartz glass substrate, and may be the same as that of the synthetic quartz glass substrate, for example.

As described above, the engraved mark is applied to the front surface of the synthetic quartz glass substrate used for the substrate for transferring microstructures of the present invention. A $CO_2$ laser is generally used to engrave characters or two-dimensional codes in the front surface of the synthetic quartz glass substrate, the present invention can also apply an engraved mark (laser mark) according to the same technique.

In the two-dimensional codes, the depth and dot size (diameter) of each of dots to be engraved are not particularly limited, but the dot depth is preferably 3 to 25 µm, and more preferably 5 to 15 µm, and the dot size is preferably 20 to 200 µm, and more preferably 30 to 180 µm.

Meanwhile, also in the case of the characters, the depth and size thereof are not particularly limited, but the depth of each of the characters is preferably 3 to 25 µm, and more preferably 5 to 15 µm, and the size of each of the characters is preferably 1,000 to 1,600 µm.

In such a range, the peripheral part of the engraved mark is less likely to involve air bubbles and the like when the silicone pressure-sensitive adhesive agent layer is provided on the front surface of the synthetic quartz glass substrate, whereby problems are less likely to occur when the engraved mark is read.

The method for reading the engraved mark can be appropriately selected from known methods, and used. Examples thereof include a device that reads a general dot matrix (so-called two-dimensional code reader). Specific examples thereof include a 2D code reader (SR-2000) manufactured by Keyence Corporation, but a two-dimensional code has various standards, and a code reader suitable for each standard should be selected. The characters may be read visually or with the reading device.

[2] Method for Manufacturing Substrate for Transferring Microstructures

The synthetic quartz glass substrate used in the present invention can be manufactured by a conventional method. Specifically, a silane compound is introduced into an oxyhydrogen flame, and a synthetic quartz ingot is obtained according to a hydrolysis reaction. The obtained ingot is sliced, chamfered, double-side lapped, double-side polished, and cleaned to obtain a synthetic quartz glass substrate.

At this time, in order to set the flatness and thickness variation of the synthetic quartz glass substrate and the power spectral density of the front surface to suitable values as described above, for example, after general lap grinding, the front surface of a hard polishing pad having hardness of 70 or more (Shore A) is flattened with an appropriate diamond pellet carrier, and the surface of the substrate is then polished with the hard polishing pad and a slurry of cerium oxide or colloidal silica.

Next, engraved marks such as characters and two-dimensional codes are applied to the front surface of the obtained synthetic quartz glass substrate on which the silicone pressure-sensitive adhesive agent layer is provided.

As a method for applying an engraved mark, the $CO_2$ laser can be used as described above. Specific examples of the $CO_2$ laser include, but are not limited to, a laser marker (ML-Z9600/9650) manufactured by Keyence Corporation.

In the $CO_2$ laser, the number of scans, an output intensity, and a scan speed and the like can be mainly set. By adjusting these, an engraved mark having a desired engraved mark depth and size can be obtained. For example, if an engraved mark is applied at a large output and a slow scan speed, the deep engraved mark is obtained, but embossment (debris) occurs around the engraved characters or dots, which causes dirt of the substrate or scratches due to contact. The embossment can be suppressed to some extent by adjusting the laser conditions, but the adjustment makes it difficult to reliably flatten the embossment. The embossment can be removed by mechanical polishing or the like to reliably flatten the embossment, but this causes an increase in the number of processes, which leads to an increase in cost.

Subsequently, a silicone pressure-sensitive adhesive agent layer is provided on the front surface of the obtained synthetic quartz glass substrate including the engraved mark in the front surface.

Examples of a method for forming a silicone pressure-sensitive adhesive agent layer include a method for directly applying an uncured silicone pressure-sensitive adhesive agent composition onto a front surface of a substrate and curing the composition, and a method for bonding a sheet-like cured product made of a silicone pressure-sensitive adhesive agent composition to a front surface of a substrate.

As the silicone pressure-sensitive adhesive agent composition, as described above, an ultraviolet-curable silicone pressure-sensitive adhesive agent composition or a thermosetting silicone pressure-sensitive adhesive agent composition may be used.

In the method for directly applying the silicone pressure-sensitive adhesive agent composition onto the front surface of the substrate and curing the composition, a substrate for transferring microstructures may be obtained by applying the silicone pressure-sensitive adhesive agent composition onto the front surface of the substrate, and then irradiating UV or heating to cure the composition.

The coating method may be selected as appropriate from known coating methods such as a spin coater, a comma coater, a lip coater, a roll coater, a die coater, a knife coater, a blade coater, a rod coater, a kiss coater, a gravure coater, screen coating, dipping coating, and casting coating, and used. The spin coater is preferably used.

When the spin coater is used, the silicone pressure-sensitive adhesive agent composition may be coated at a thickness of preferably 1 to 100 μm, more preferably 10 to 30 μm, and still more preferably 15 to 25 μm by spin coating, and then placed in a heating furnace at preferably 20 to 200° C. for 5 to 90 minutes for curing, or irradiated with ultraviolet rays for curing, to obtain a silicone pressure-sensitive adhesive agent layer.

The silicone pressure-sensitive adhesive agent composition may be applied onto the front surface of the synthetic quartz glass substrate including the engraved mark in the front surface by each of the above coating methods, and then cured while being press-molded or compression-molded, to obtain a substrate for transferring microstructures, having high flatness and good thickness variation.

Meanwhile, in the method for bonding a sheet-like cured product made of the silicone pressure-sensitive adhesive agent composition onto the front surface of the synthetic quartz glass substrate including the engraved mark in the front surface, the silicone pressure-sensitive adhesive agent composition is molded into a sheet shape, and the sheet is then bonded to the synthetic quartz glass substrate. As a result, a substrate for transferring microstructures can be obtained.

Examples of the method for molding the silicone pressure-sensitive adhesive agent composition into a sheet shape include roll forming, press molding, transfer molding, and compression molding.

The composition is preferably molded into the sheet-like cured product while sandwiching the composition between plastic films in order to prevent adhesion of dust and the like and suppress oxygen inhibition during curing. When the obtained sheet-like cured product is larger than a desired size, it may be cut to the desired size.

Furthermore, in order to increase the adhesion between the sheet-like cured product and the synthetic quartz glass substrate including the engraved mark in the front surface, either one or both of the bonding surfaces may be subjected to plasma treatment, excimer laser treatment, or chemical treatment or the like. Any adhesive agents or pressure-sensitive adhesive agents and the like may be used in order to improve the bonding strength. Specific examples of the adhesive agents or the pressure-sensitive adhesive agents include silicone-based, acrylic-based, and epoxy-based adhesive agents.

As the bonding method, roll bonding or vacuum pressing or the like can be used.

The conditions for curing the heat-curable or ultraviolet-curable silicone pressure-sensitive adhesive agent composition can be appropriately set depending on the silicone pressure-sensitive adhesive agent composition to be used.

The substrate for transferring microstructures, obtained as described above can be applied to, for example, the transfer of microstructures such as an element of a micro LED display.

The transfer of the microstructures using the substrate for transferring microstructures of the present invention can be performed by, for example, the following technique.

That is, a plurality of microstructures formed on one surface of a supply substrate and a silicone pressure-sensitive adhesive agent layer provided on the substrate for transferring microstructures of the present invention are bonded to each other. Some or all of the plurality of microstructures are separated from the supply substrate, and transferred to the substrate for transferring microstructures, including the silicone pressure-sensitive adhesive agent layer, whereby the transferring substrate in which the plurality of microstructures are temporarily fixed is obtained.

The obtained transferring substrate in which the plurality of microstructures are temporarily fixed is bonded to another transferring substrate for use in the next step, and is transferred in the same manner as described above. In order to transfer the elements by bonding, a difference in adhesive force between silicone resins, laser ablation, or a technique such as laser lift-off may be used.

EXAMPLES

Hereinafter, the present invention is described in more detail with reference to Examples and Comparative Examples, but the present invention is not limited to these Examples.

Example 1

A synthetic quartz, glass substrate having a circular disk shape, an outer diameter of 150 mm, and a thickness of 1.0 mm was manufactured. When an arbitrary region of 6.01 mm×6.01 mm in the front and back surfaces of the synthetic quartz glass substrate was measured at a pixel count of 1240×1240 with a white light interferometer (Nexview NX2, manufactured by Zygo Corporation, the same applies hereinafter), a power spectral density at a spatial frequency of 1 mm$^{-1}$ or more to be obtained was $10^{12}$ nm$^4$ or less. The surface roughness (Ra) of each of the front and back surfaces measured with an atomic force microscope (NX20, manufactured by Park SYSTEMS, the same applies hereinafter) was 0.01 μm.

As shown in FIGS. 1A and 1B, an engraved mark 12 was applied to a front surface 11 of a synthetic quartz glass substrate 10 using a laser marker (ML-Z9600/9650, manufactured by Keyence Corporation, the same applies hereinafter). The engraved mark 12 was a two-dimensional matrix code symbol specified in SEMI T7 0303, and was formed at a position of 1 mm from the edge of the front surface 11 of the synthetic quartz glass substrate 10. The content of a dot of the engraved mark 12 was "20010012A1D6". The conditions of a laser used to form the engraved mark 12 included an output intensity of 70%, a scan speed of 100 mm/sec, the number of scans of 2, and a cell size of 0.115 mm.

The depth of the dot matrix of the engraved mark 12 obtained under such conditions and measured with a stylus type undulation meter (Surfcom NEX041, manufactured by Tokyo Seimitsu Co., Ltd., the same applies hereinafter) was 20 µm. When the dot size was measured with a microscope, the dot had a circle shape, and had a diameter of 100 µm.

The obtained synthetic quartz glass substrate 10 including the engraved mark was subjected to ultrasonic pure water cleaning, and then dried.

Separately, a base compound (STP-204, manufactured by Shin-Etsu Chemical Co., Ltd.) of a liquid heat-curable silicone pressure-sensitive adhesive agent composition and a curing agent (STP-204 (CAT), manufactured by Shin-Etsu Chemical Co., Ltd.) were mixed at 100:10 (mass ratio), and the mixture was then applied to the front surface including the engraved mark at 2,500 rpm for 2 minutes using a spin coater. Then, the mixture was cured by heating at 150° C. for 5 minutes on a hot plate, and further at 150° C. for 25 minutes in an oven to provide a silicone pressure-sensitive adhesive agent layer 20, thereby obtaining a substrate 1 for transferring microstructures.

When the dot matrix of the engraved mark 12 was read by using a two-dimensional reader (2D code reader SR-2000, manufactured by Keyence Corporation, the same applies hereinafter) from the back side of the produced substrate 1 for transferring microstructures (the side where the silicone pressure-sensitive adhesive agent layer 20 was not provided), the dot matrix could be correctly read as "20010012A1D6". When the dot matrix of the engraved mark 12 was similarly read from above the silicone pressure-sensitive adhesive agent layer 20 on the front side of the substrate 1 for transferring microstructures, the dot matrix could be correctly read as "20010012A1D6".

Furthermore, when an LED element obtained by epitaxial growth on a sapphire substrate and isolation was attached to the resin side, and transferred by laser lift-off, the element was reliably transferred. When the dot matrix was read in the same manner as above after the elements were continuously transferred 10,000 times, the dot matrix could be correctly read as "20010012A1D6". When the dot matrix was read in the same manner as above after the elements were continuously transferred 10,000 times, the dot matrix could be correctly read as "20010012A1D6".

Comparative Example 1

A synthetic quartz glass substrate having a circular disk shape, an outer diameter of 150 mm, and a thickness of 1.0 mm was manufactured. When an arbitrary region of 6.01 mm×6.01 mm in the front and back surfaces of the synthetic quartz glass substrate was measured at a pixel count of 1240×1240 with a white light interferometer, a power spectral density at a spatial frequency of $1~\text{mm}^{-1}$ or more to be obtained was $10^{12}~\text{nm}^4$ or less. The surface roughness (Ra) of each of the front and back surfaces measured with an atomic force microscope was 0.01 µm.

A back surface of the synthetic quartz glass substrate was engraved using a laser marker. The engraved mark was a two-dimensional matrix code symbol specified in SEMI T7 0303, and was engraved at a position of 1 mm from the edge of the front surface of the synthetic quartz glass substrate. The content of the engraved dot was "20010012A1D6". The conditions of a laser for engraving included an output intensity of 70%, a scan speed of 100 mm/sec, the number of scans of 2, and a cell size of 0.115 mm.

The depth of the dot matrix obtained by engraving under such conditions and measured with a stylus type undulation meter was 20 µm. When the dot size was measured with a microscope, the dot had a circle shape, and had a diameter of 100 µm.

The obtained synthetic quartz glass substrate including the engraved mark was subjected to ultrasonic pure water cleaning, and then dried.

Separately, the same heat-curable silicone pressure-sensitive adhesive agent composition (base compound/curing agent=100/10) as that in Example 1 was applied to the front surface including the engraved mark at 2,500 rpm for 2 minutes using a spin coater. Then, the composition was cured by heating at 150° C. for 5 minutes on a hot plate, and further at 150° C. for 25 minutes in an oven to provide a silicone pressure-sensitive adhesive agent layer, thereby obtaining a substrate for transferring microstructures.

When the dot matrix of the engraved mark was read by using a two-dimensional reader from the back side of the produced substrate for transferring microstructures (the side where the silicone pressure-sensitive adhesive agent layer was not provided), the dot matrix could be correctly read as "20010012A1D6". When the dot matrix of the engraved mark was similarly read from above the silicone pressure-sensitive adhesive agent layer on the front side of the substrate for transferring microstructures, the dot matrix could be correctly read as "20010012A1D6".

Furthermore, when an LED element obtained by epitaxial growth on a sapphire substrate and isolation was attached to the resin side, and transferred by laser lift-off, the element was reliably transferred. When the dot matrix was read in the same manner as above after the elements were transferred 10,000 times, the dot matrix could not also correctly read as "20010012A1D6" from the top of the silicone pressure-sensitive adhesive agent layer on the front side of the substrate and the back side of the substrate. It was presumed that the engraved mark cannot be read by dirt adhering to the engraved mark provided in the back surface and scratches due to debris, and the like in the process of using the substrate for transferring the element.

Japanese Patent Application No. 2020-085108 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A substrate for transferring microstructures, comprising:
    a synthetic quartz glass substrate having a front surface and a back surface; and
    a pressure-sensitive adhesive agent layer provided on the front surface of the synthetic quartz glass substrate,
    wherein the substrate includes an engraved mark provided in the front surface such that the engraved mark does not go all the way through the substrate, wherein the engraved mark is covered by said pressure-sensitive agent layer by applying said pressure-sensitive adhesive agent layer to said substrate and said engraved mark after said engraved mark is formed and said substrate can be used to transfer microstructures with bonding said pressure-sensitive adhesive agent layer to said microstructures.

2. The substrate for transferring microstructures according to claim 1, wherein the pressure-sensitive adhesive is applied to only the front surface, and not the back surface, and is not applied to the sides of the substrate.

3. The substrate for transferring microstructures according to claim 1, wherein the engraved mark is located at or near the edge of the substrate.

4. The substrate for transferring microstructures according to claim 1, wherein the substrate comprises only two layers.

5. A substrate for transferring microstructures, comprising:
- a synthetic quartz glass substrate having a front surface and a back surface; and
- a silicone pressure-sensitive adhesive agent layer provided on the front surface of the synthetic quartz glass substrate,
- wherein the substrate includes an engraved mark provided in the front surface such that the engraved mark does not go all the way through the substrate, wherein the engraved mark is covered by said silicone pressure-sensitive agent layer by applying said silicone pressure-sensitive adhesive agent layer to said substrate and said engraved mark after said engraved mark is formed and said substrate can be used to transfer microstructures with bonding said silicone pressure-sensitive adhesive agent layer to said microstructures.

6. The substrate for transferring microstructures according to claim 5, wherein the synthetic quartz glass substrate has a power spectral density of $10^{12}$ nm$^4$ or less at a spatial frequency of 1 mm$^{-1}$ or more, the power spectral density being obtained by measuring a region of 6.01 mm×6.01 mm in the front and back surfaces of the synthetic quartz glass substrate at a pixel count of 1240×1240 with a white light interferometer.

7. The substrate for transferring microstructures according to claim 5, wherein surface roughness (Ra) of the back surface of the synthetic quartz glass substrate is 0.05 μm or less.

8. The substrate for transferring microstructures according to claim 5, wherein the engraved mark is a laser mark having a depth of 3 to 25 μm and a dot size of 20 to 200 μm.

9. The substrate for transferring microstructures according to claim 8, wherein the synthetic quartz substrate and the silicone pressure-sensitive adhesive agent layer form a laminated body and the variation in the thickness of the laminated body is 12 μm or less.

10. The substrate for transferring microstructures according to claim 8, wherein the synthetic quartz substrate and the silicone pressure-sensitive adhesive agent layer form a laminated body and the variation in the thickness of the laminated body is 2 μm or less.

11. The substrate for transferring microstructures according to claim 8, wherein the thickness of the silicone pressure-sensitive agent layer is 10 to 30 μm.

12. The substrate for transferring microstructures according to claim 5, wherein the pressure-sensitive adhesive is applied to only the front surface, and not the back surface, and is not applied to the sides of the substrate.

13. The substrate for transferring microstructures according to claim 5, wherein the engraved mark is located at or near the edge of the substrate.

14. The substrate for transferring microstructures according to claim 5, wherein the substrate comprises only two layers.

15. A method for manufacturing the substrate for transferring microstructures according to claim 5, the method comprising the steps of:
- providing an engraved mark in a front surface of a synthetic quartz glass substrate to obtain the synthetic quartz glass substrate including the engraved mark; and
- providing a silicone pressure-sensitive adhesive agent layer on the front surface of the synthetic quartz glass substrate including the engraved mark.

16. The method for manufacturing a substrate for transferring microstructures according to claim 15, wherein the step of providing the silicone pressure-sensitive adhesive agent layer is a step of applying a silicone pressure-sensitive adhesive agent composition onto the front surface of the synthetic quartz glass substrate including the engraved mark, followed by curing.

17. A method for manufacturing a substrate for transferring microstructures according to claim 15, wherein the step of providing the silicone pressure-sensitive adhesive agent layer is a step of bonding a cured product made of a silicone pressure-sensitive adhesive agent composition onto the front surface of the synthetic quartz glass substrate including the engraved mark.

18. A method for transferring microstructures, comprising a step of transferring microstructures by using the substrate of claim 5.

19. A method for manufacturing an electronic device, comprising a step of transferring microstructures by using the substrate of claim 5.

20. A method for manufacturing a micro LED display, comprising a step of transferring a micro LED by using the substrate of claim 5.

* * * * *